(12) United States Patent
Pan et al.

(10) Patent No.: US 7,062,141 B2
(45) Date of Patent: Jun. 13, 2006

(54) DEPOSITION OF THICK BPSG LAYERS AS UPPER AND LOWER CLADDING FOR OPTOELECTRONICS APPLICATIONS

(75) Inventors: Rong Pan, San Jose, CA (US); Van Q. Ton, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 221 days.

(21) Appl. No.: 10/319,417

(22) Filed: Dec. 12, 2002

(65) Prior Publication Data

US 2004/0114900 A1   Jun. 17, 2004

(51) Int. Cl.
   *G02B 6/10*   (2006.01)
(52) U.S. Cl. ............... 385/129; 385/131; 65/386
(58) Field of Classification Search ........ 385/129–132; 65/385–386
   See application file for complete search history.

(56) References Cited

U.S. PATENT DOCUMENTS

| | | |
|---|---|---|
| 5,648,175 A | 7/1997 | Russell et al. |
| 5,812,403 A | 9/1998 | Fong et al. |
| 5,879,574 A | 3/1999 | Sivaramakrishnan et al. |
| 5,885,881 A | 3/1999 | Ojha |
| 5,904,491 A | 5/1999 | Ojha et al. |
| 5,935,334 A | 8/1999 | Fong et al. |
| 5,935,340 A | 8/1999 | Xia et al. |
| 5,939,831 A | 8/1999 | Fong et al. |
| 5,963,840 A | 10/1999 | Xia et al. |
| 5,968,587 A | 10/1999 | Frankel |
| 5,994,209 A | 11/1999 | Yich et al. |
| 6,019,848 A | 2/2000 | Frankel et al. |
| 6,044,192 A | 3/2000 | Grant et al. |

(Continued)

OTHER PUBLICATIONS

A.K. Dutta, "Annealing Effect on Interfaces of Atmospheric Pressure Chemical-Vapor-Deposited Multilayer Doped Silicon Oxides for Optical Waveguides," J. Electrochem. Soc., vol. 144, p. 1073-81 (1997).

(Continued)

*Primary Examiner*—Sung Pak
(74) *Attorney, Agent, or Firm*—Townsend and Townsend and Crew, LLP

(57) ABSTRACT

Undercladding and uppercladding layers that form part of an optical waveguide are deposited with a thermal CVD technique. The optical waveguide has a structure in which optical cores are formed over the undercladding layer and in which the uppercladding layer is formed over and between the optical cores. Generally, the optical cores have a refractive index greater than a refractive index of the cladding layers. A borophosphosilicate-glass layer may be used as one or both of the cladding layers. Thick cladding layers may be formed by cyclically depositing and annealing portions of the layer.

27 Claims, 15 Drawing Sheets

U.S. PATENT DOCUMENTS

| | | | |
|---|---|---|---|
| 6,099,647 | A | 8/2000 | Yich et al. |
| 6,114,216 | A | 9/2000 | Yich et al. |
| 6,177,290 | B1 | 1/2001 | Jang et al. |
| 6,218,268 | B1 | 4/2001 | Xia et al. |
| 6,248,673 | B1 | 6/2001 | Huang et al. |
| 6,347,636 | B1 | 2/2002 | Xia et al. |
| 6,348,099 | B1 | 2/2002 | Xia et al. |
| 6,352,591 | B1 | 3/2002 | Yich et al. |
| 6,356,694 | B1 | 3/2002 | Weber |
| 2002/0006729 | A1 | 1/2002 | Geiger er al. |
| 2003/0044151 | A1* | 3/2003 | Zhong et al. ............ 385/129 |
| 2003/0152353 | A1* | 8/2003 | Inoue et al. ............ 385/129 |

OTHER PUBLICATIONS

Y. Arita et al., "Multi-level Interconnection Technology for Quarter-micron LSI," NTT R&D, vol. 46, p. 371-8 (1997).

Won Ko Shin et al., "Flame Chemical Vapor Deposition Ti doped Borophosphosilicate Glass," Korean Applied Phys., vol. 8, p. 1-5 (1995).

J.H. Smith et al., "Monolithic Integration of Waveguide Structures with Surface-micromachined Polysilicon Actuators," Smart Structures I& Materials, p. 1-8, Feb. 1996.

* cited by examiner

DEPOSITION OF THICK BPSG LAYERS AS UPPER AND LOWER CLADDING FOR OPTOELECTRONICS APPLICATIONS

BACKGROUND OF THE INVENTION

Much effort is currently being devoted to the development of optical networking systems as an alternative to electronic-based networks. In this emerging technology, pulses of light are used instead of currents of electrons to carry out such diverse networking functions as data transmission, data routing, and other forms of data communication and processing. Such functions are achieved with a number of discrete components, but integral to virtually all developing optical networking systems are optical-waveguide structures that are used to guide light being propagated from one location to another. For example, in one specific application that is being aggressively developed, optical waveguides are used to confine and carry optical signals in conformity with a dense wavelength division multiplexed ("DWDM") protocol. Such a protocol increases the amount of information carried with individual optical signals by multiplexing discrete wavelength components, thereby increasing the effective bandwidth that may be accommodated with the optical networking system.

To illustrate the use of optical waveguides in such systems, FIG. 1 provides a cross-sectional view of a typical optical-fiber waveguide 100. The waveguide includes two principal components—a core 104 through which the light is propagated and a cladding layer 102 that acts to confine the light. To ensure that the light is confined, the core 104 is usually surrounded completely by the cladding layer 102, which also generally has a lower refractive index ("RI"). The difference in refractive indices of the core 104 and cladding layer 102 permit light to be confined by total internal reflection within the core 104. FIG. 1 illustrates the concept of total internal reflection with an exemplary light ray 106, with the confinement angle $\theta_c$ representing an upper limit on angles at which the light can be incident on the core/cladding interface without leakage.

As more wavelength components are incorporated into optical-waveguide channels within DWDM systems, there is a corresponding increase in demand for optical components to perform routing, switching, add/drop, and other functions. A variety of photonic components have the capacity to perform such functions, including, for example, filters, modulators, amplifiers, couplers, multiplexers, cross connects, arrayed waveguide gratings, power splitters, star couplers, and others. As optical networking technology matures, however, one goal is to integrate various photonic components monolithically onto a single structure, such as a silicon-chip or glass substrate.

A number of efforts have been made at such development, but attempts to integrate optical waveguides and photonic components onto a single chip have faced significant challenges. Some approaches have attempted to modify techniques for monolithic integration of electronic components, but have encountered a variety of difficulties. These difficulties often arise from fundamental differences between photonic and electronic applications. For example, the scale of photonics applications is much greater than the scale for electronics applications, sometimes as much as an order of magnitude. This difference in scale results in a need to deposit much thicker layers in photonics applications. This increased thickness has resulted both in cracking of structures because of increased stresses and in much greater variations in uniformity of the structures. In addition, techniques for monolithic integration of electronic components have been sharply focused on optimizing the dielectric constant of materials because of its importance in electronic applications. In contrast, photonic applications are instead sensitive to optical characteristics of materials, such as its refractive index. It has often been found that the methods and materials used for producing structures in electronic applications simply do not meet the optical requirements of photonic applications.

One prior-art technique that has been widely used in producing optical waveguides is flame hydrolysis. This technique is not only very costly, but has, in practice with large substrates, been found to produce structures with poor uniformity. Other techniques have been used in attempts at mitigating thermal strain by separately depositing a lower cladding layer, over which optical cores are formed, and subsequently depositing an upper cladding layer over and between the optical cores. One specific technique that has been used in such efforts is plasma-enhanced chemical-vapor deposition ("PECVD"). An example of an optical-waveguide structure formed using PECVD is shown in FIG. 2.

The cross sectional view of the optical waveguide structure 200 provided in FIG. 2 shows four optical cores 206. Light is intended to travel through each optical core 206 in a direction orthogonal to the page. The optical cores 206 are formed over an undercladding layer 204, which is itself formed over a substrate 202. The uppercladding layer 208 has been deposited with PECVD. Use of PECVD techniques is known to produce layers having significant levels of hydrogen impurities, which leads to undesirable nonuniformities in refractive index in the cladding layers. The negative effect of such nonuniformities is further exacerbated by the nonconformal nature of PECVD deposition since portions of the cladding layer may be very thin near parts of each core. Moreover, as shown in FIG. 2, such nonconformal deposition can lead to the formation of voids in the cladding layer that interfere with optical transmission and permit unsatisfactory propagation losses.

There is accordingly a persistent need for improved methods and systems for manufacturing optical waveguides with cladding layers that simultaneously meet stringent refractive-index requirements, are resistant to cracking, and are amenable to efficient use in low-cost production environments.

BRIEF SUMMARY OF THE INVENTION

These criteria are met in embodiments of the invention that provide a method for forming an optical waveguide. Similar methods are provided for forming either an undercladding layer or an uppercladding layer, using a thermal CVD technique such as SACVD or APCVD.

In one embodiment, a gaseous mixture is provided to a chamber at a pressure substantially between 100 torr and 800 torr. The gaseous mixture may be provided from vaporized liquid sources. An undercladding layer is deposited over a substrate with the gaseous mixture using the thermal CVD technique. A plurality of optical cores are formed over the deposited undercladding layer. Generally, the optical cores will have a refractive index greater than a refractive index of the undercladding layer. In some embodiments, the gaseous mixture comprises a boron-containing gas, a phosphorus-containing gas, a silicon-containing gas, and an oxygen-containing gas, one or more of which may be provided from vaporized liquid sources. In such embodiments, the undercladding layer comprises a borophosphosilicate-glass layer. In some embodiments, the boron concentration of the undercladding layer is substantially between 3 wt. % and 8 wt. % and may be between 4.5 wt. % and 6.5 wt. % in other embodiments. In some embodiments, the phosphorus concentration of the undercladding layer may be between 1 wt. % and 3 wt. %. In some embodiments, the undercladding layer achieves a thickness as great as, or greater than, 15 μm by using a cyclic procedure of depositing a portion of the layer and then annealing the layer. Such annealing may be performed in different atmospheres. In one embodiment, annealing is performed at a temperature substantially between 900° C. and 1050° C.

Similar methods may be used for depositing an uppercladding layer on a structure that already includes optical cores, in which case the deposition also fills gaps between the optical cores. A gaseous mixture is provided to a chamber at a pressure substantially between 100 torr and 800 torr, and the uppercladding layer is deposited with a thermal CVD process such as SACVD or APCVD. Gases may be provided to form a borophosphosilicate-glass layer, which may in some instances have a similar composition to that described for the undercladding layer. In addition, the cyclic use of deposition and annealing processes may also be used in the formation of the uppercladding layer to achieve layers as thick as, or greater than, 15 μm.

The methods of the present invention may be embodied in a computer-readable storage medium having a computer-readable program embodied therein for directing operation of a substrate processing system. Such a system may include a process chamber, a substrate holder, a pressure-control system, and a gas-delivery system. The computer-readable program includes instructions for operating the substrate processing system to form part of an optical waveguide in the process chamber in accordance with the embodiments of the present invention.

BRIEF DESCRIPTION OF THE DRAWINGS

A further understanding of the nature and advantages of the present invention may be realized by reference to the remaining portions of the specification and the drawings.

DETAILED DESCRIPTION OF THE INVENTION

1. Introduction

Figure 1:
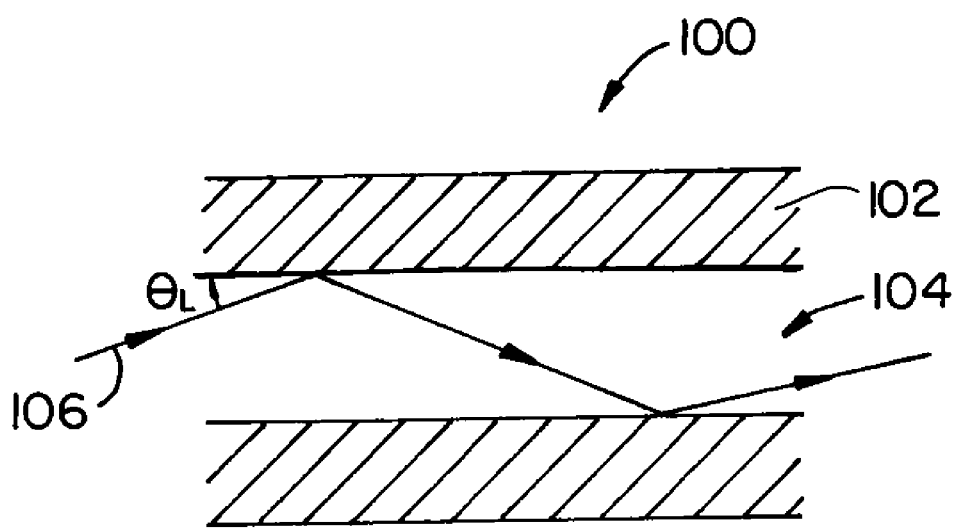
FIG. 1 is an internal view of an optical-fiber waveguide illustrating the principle of total internal reflection.
Figure 2:
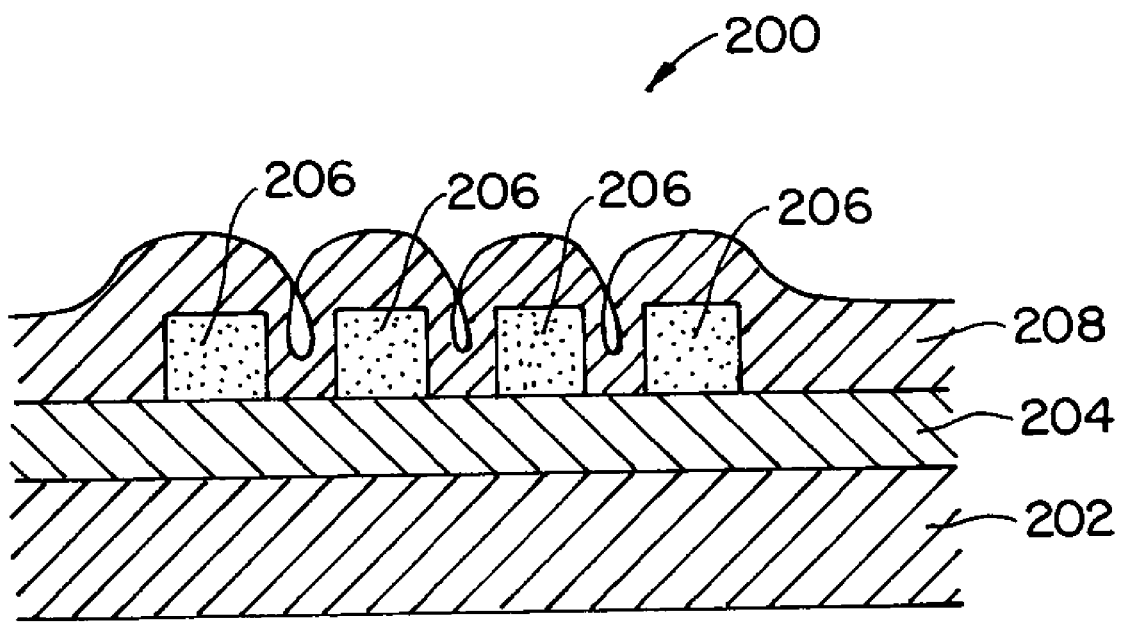
FIG. 2 is a cross-sectional view of an optical waveguide structure made using PECVD to form the cladding layers.

Embodiments of the present invention were developed when the inventors were confronted with the task of developing a method and system for manufacturing optical waveguides that did not suffer as extensively from problems in the prior art. The inventors were particularly aware of the need to mitigate deficiencies known to be inherent with PECVD approaches, namely the propensity of cladding layers to crack because of their large thicknesses and difficulties in maintaining stringent refractive-index requirements during fabrication. This particular focus on optical characteristics and on the much larger scale when compared with electronic applications severely limited the relevance of problem-solving strategies developed for such electronic applications. Such strategies were especially constrained because they had been optimized for a very different physical scale and for a very different physical application.

Accordingly, the inventors considered a variety of different approaches that might be used for forming optical waveguide structures. Some such approaches were rejected because it appeared that they could still suffer from some of the same deficiencies as previous efforts. Eventually, the inventors realized that a particular combination of factors might be capable of avoiding, or at least mitigating, some of these deficiencies. In particular, the inventors realized that a thermal CVD method could be used to deposit a layer conformally around a core structure, thereby helping to avoid the formation of voids and achieving improved uniformity of optical characteristics of the layer. Specific thermal CVD methods that were considered as possibilities included subatmospheric CVD ("SACVD"), in which gas is provided at a pressure between about 100 torr and 700 torr. More generally, the methods described herein may be used throughout the pressure range of 100 torr–800 torr, thereby including atmospheric-pressure CVD ("APCVD") processes, in which gas is provided near atmospheric pressure, i.e. between about 700 torr and 800 torr. In addition, the inventors recognized that the stress characteristics of layers deposited by thermal CVD methods might make it possible to build up the necessary thickness without cracking by using a series of deposition and annealing steps.

Further consideration of such an approach to the problem yielded still further insights that suggested additional possible benefits. In particular, it was believed that the combination of thermal-CVD deposition and annealing could improve the optical characteristics of the layers further by exploiting the better reflow characteristics of thermal-CVD layers compared with PECVD layers. In addition, the use of a thermal-CVD technique avoids the possibility of plasma damage to layers that is always inherent with a PECVD technique.

While this approach appeared to hold promise for producing layers with acceptably uniform optical characteristics, it remained unclear whether that uniformity could be provided at the specific required values for the refractive index. The inventors considered different materials that might be used, and decided to develop a series of experimental tests to determine whether a borophosphosilicate glass ("BPSG") with the desired refractive index could be achieved with the method. At this stage in the investigation, it remained unclear whether the thermal-CVD process combined with multiple anneals could achieve the desired optical characteristics. In some embodiments the desired refractive index is approximately 1.4575, although in alternative embodiments it may be constrained to be within the range of 1.4550–1.4600, within the range 1.4500–1.4650, or to vary by less than 2% from the value of 1.4575. The subsequent series of experimental tests, some of which are described below, confirmed that these objectives could be met, at least under certain processing conditions.

2. Formation of Undercladding and Uppercladding Layers

Figure 3:
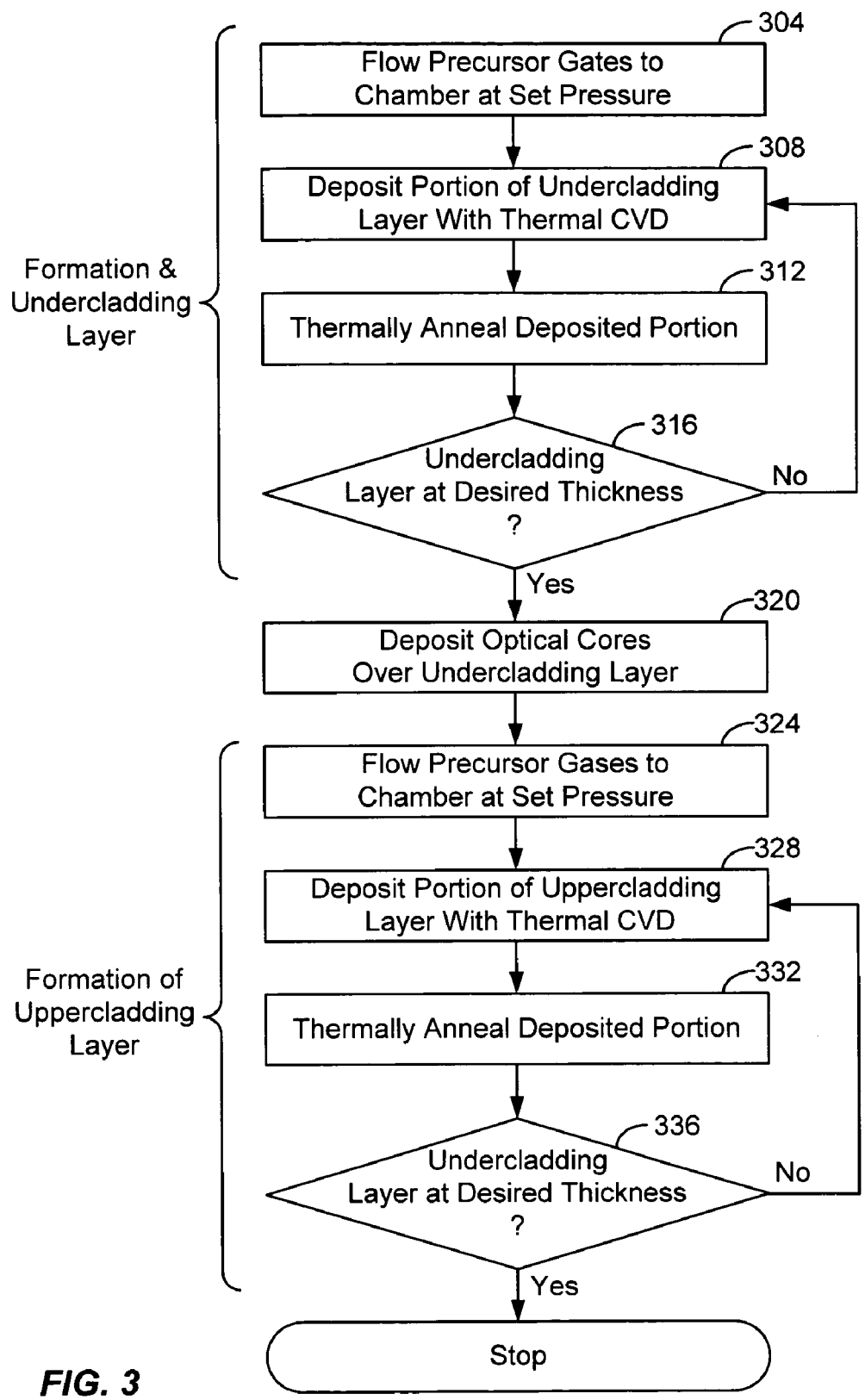
FIG. 3 is a flow diagram illustrating methods used in embodiments of the invention.

FIG. 3 thus provides an overview of aspects of methods for depositing both undercladding and uppercladding layers for optical waveguides in different embodiments with a flow diagram. FIGS. 4A–6B provide results using different embodiments of the methods to illustrate certain aspects of the invention determined by the inventors from the series of experimental tests.

FIG. 3 may be considered as having three distinct sections: (1) blocks 304, 308, 312, and 316, which correspond to the formation of an undercladding layer; (2) block 320, which corresponds to the formation of optical cores; and (3) blocks 324, 328, 332, and 336, which correspond to the formation of an uppercladding layer. While in some embodiments the entire flow diagram may be implemented to form an optical waveguide, in other embodiments only portions of the flow diagram are used. In such instances, an undercladding layer may be formed as part of an optical-waveguide structure by itself, or an uppercladding layer may be formed as part of an optical-waveguide structure by itself. It is possible, for example, for an optical waveguide to be fabricated using an embodiment of the method for forming an undercladding layer but not for forming an uppercladding layer; similarly, an optical waveguide could be fabricated using a different method for forming an undercladding layer, but using one of the embodiments described herein for forming an uppercladding layer.

Thus, at block 304, precursor gases are flowed into a process chamber at a certain pressure. The precursor gases may be provided by vaporizing liquid sources. In some embodiments, the pressure is between 100 torr and 800 torr so that the thermal CVD deposition of the undercladding layer at block 308 may be considered to be an SACVD or APCVD technique. In a particular embodiment, an SACVD process is used in which the pressure is between 100 torr and 300 torr. In some embodiments, only a portion of the undercladding layer is deposited at block 308 from the precursor gases. This permits the deposited portion to be thermally annealed at block 312 and for the full undercladding layer to be built up by cycling deposition and annealing stages. Such cycling is illustrated in the figure with block 316, at which point a check is made to determine whether the desired thickness of the undercladding layer has been reached, with blocks 308 and 312 being repeated until the full desired thickness has been reached.

Any suitable sources may be used to provide the precursor gases. In one embodiment, liquid sources of tetraethoxysilane ("TEOS"), triethylborane ("TEB"), and triethylphosphate ("TEPO") are used respectively as sources of silicon, boron, and phosphorus, and $O_3$ is used as a source of oxygen. The liquid TEOS, TEB, and TEPO sources are vaporized by a bubbler to be provided to a chamber through a gas-distribution manifold after the vaporized gases are mixed with a helium carrier gas.

In various embodiments, the thermal annealing at block 312 may be performed in various different ways. For example, in one embodiment, an ex situ process is used by performing the thermal annealing at block 312 separately from the deposition at block 308. Alternatively, the thermal anneal may be performed in a different chamber of a multichamber system so that the substrate is still not exposed to an ambient atmosphere. For example, a rapid thermal processing ("RTP") chamber may be incorporated with the system for performing the thermal anneal. In still other embodiments, the same chamber may be used for the anneal at block 312 as for the deposition at block 308, thereby achieving an in situ process.

After the undercladding layer has been deposited, any suitable technique may be used to deposit optical cores over the undercladding layer at block 320. In some embodiments, the optical cores may comprise a silicon oxide material and in other embodiments may comprise a nitride material. In one embodiment, the core comprises Ge-doped silicon oxide. In another embodiment, the core comprises phosphorus-doped silicon having a phosphorus concentration of about 7 wt. %. The uppercladding layer may then be deposited using a similar technique to that described for the undercladding layer. One specific difference in application is that deposition of the uppercladding layer is sensitive to gapfill concerns because the uppercladding layer is formed between the optical cores as well as over them.

Thus, at block 324, precursor gases suitable for deposition of the uppercladding layer are provided to the chamber at a set pressure. Again, the precursor gases may be provided by vaporizing liquid sources. The pressure used for deposition of the uppercladding layer may also be between 100 torr and 800 torr so that the thermal CVD deposition technique used at block 328 may be considered to be an SACVD or APCVD technique. In some embodiments, a cyclic process of deposition and annealing is used to form the full uppercladding layer. Thus, at block 328, a portion of the uppercladding layer is deposited using SACVD or APCVD and then thermally annealed at block 332. The process of deposition and annealing continues until the entire uppercladding layer has been deposited, as checked at block 336. As for the undercladding layer, any suitable sources may be used to provide the precursor gases, such as by using liquid sources TEOS, TEB, and TEPO respectively as sources of silicon, boron, and phosphorus, with $O_3$ as a source of oxygen.

Similar to the formation of the undercladding layer, the thermal annealing at block 332 during formation of the uppercladding layer may be performed in different ways in various embodiments. For example, in one embodiment, an ex situ process is used by performing the thermal annealing at block 332 separately from the deposition at block 328. Alternatively, the thermal anneal may be performed in a different chamber of a multichamber system so that the substrate is still not exposed to an ambient atmosphere, such as where an RTP chamber is incorporated with the system. In still other embodiments, an in situ process may be achieved by using the same chamber for the anneal at block 332 as for the deposition at block 328.

The inventors have performed a number of experimental tests of the processes outlined in connection with FIG. 3 to determine suitable process parameters for achieving undercladding and/or uppercladding layers having the desired properties. The results of such experimental tests are presented in FIGS. 4A–4E, and exemplary process parameters determined from analysis of the experimental results are summarized in the following section.

Figure 4A:
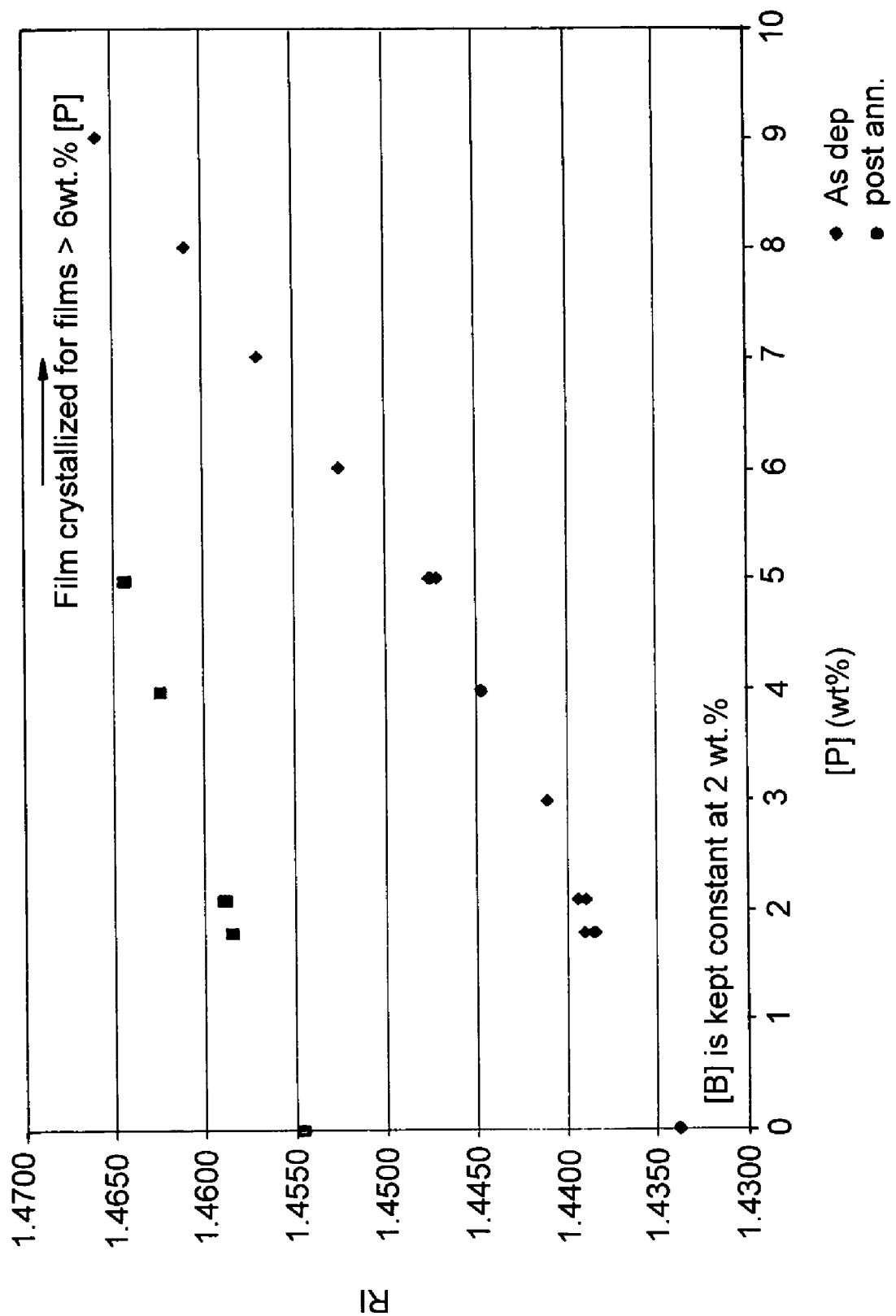
FIG. 4A is a graph showing the effect of varying boron concentration on the refractive index of BPSG.
Figure 4B:
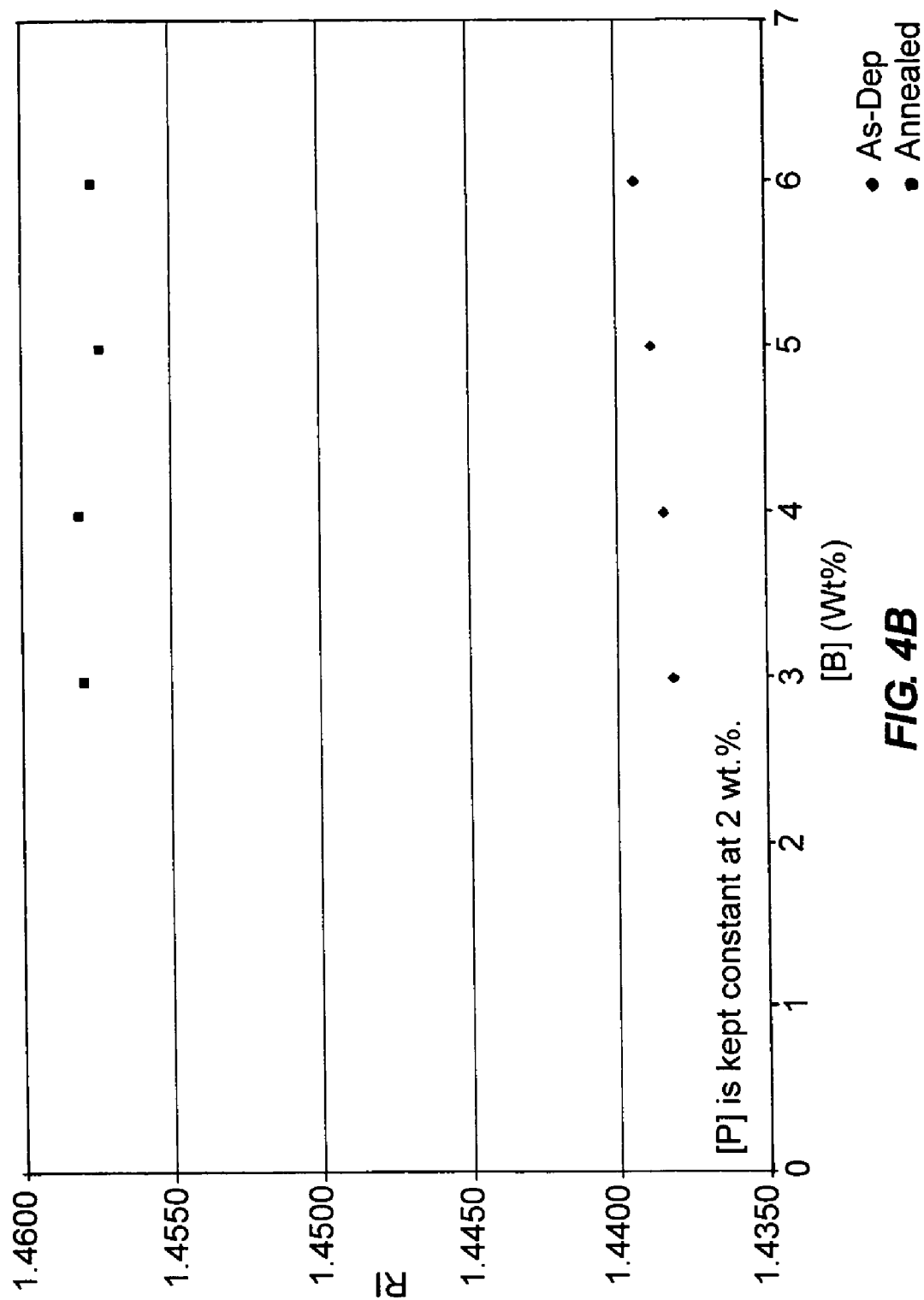
FIG. 4B is a graph showing the effect of varying phosphorus concentration on the refractive index of BPSG.
Figure 4C:
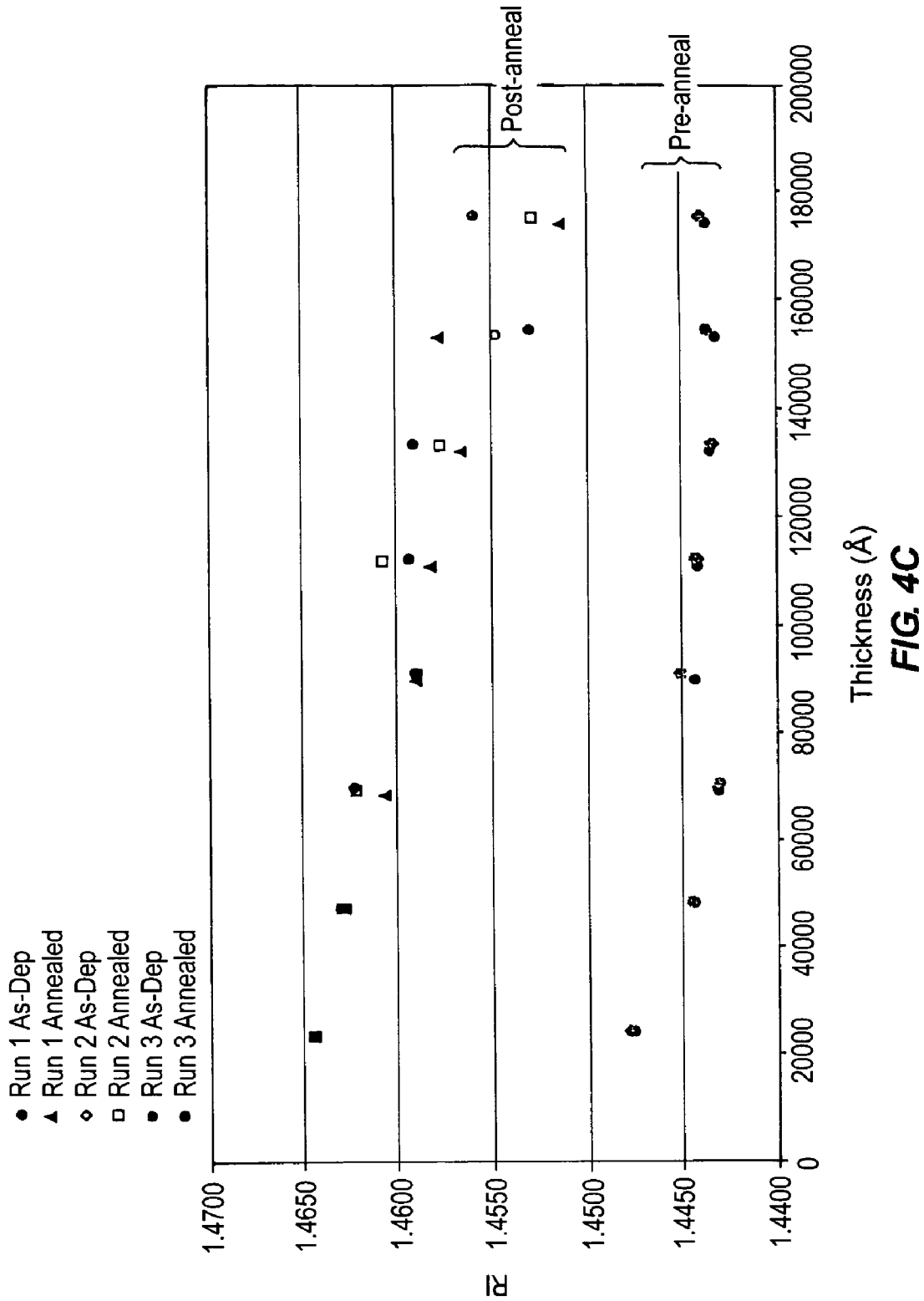
FIG. 4C is a graph showing the effect of layer thickness and thermal annealing on the refractive index of BPSG.
Figure 4D:
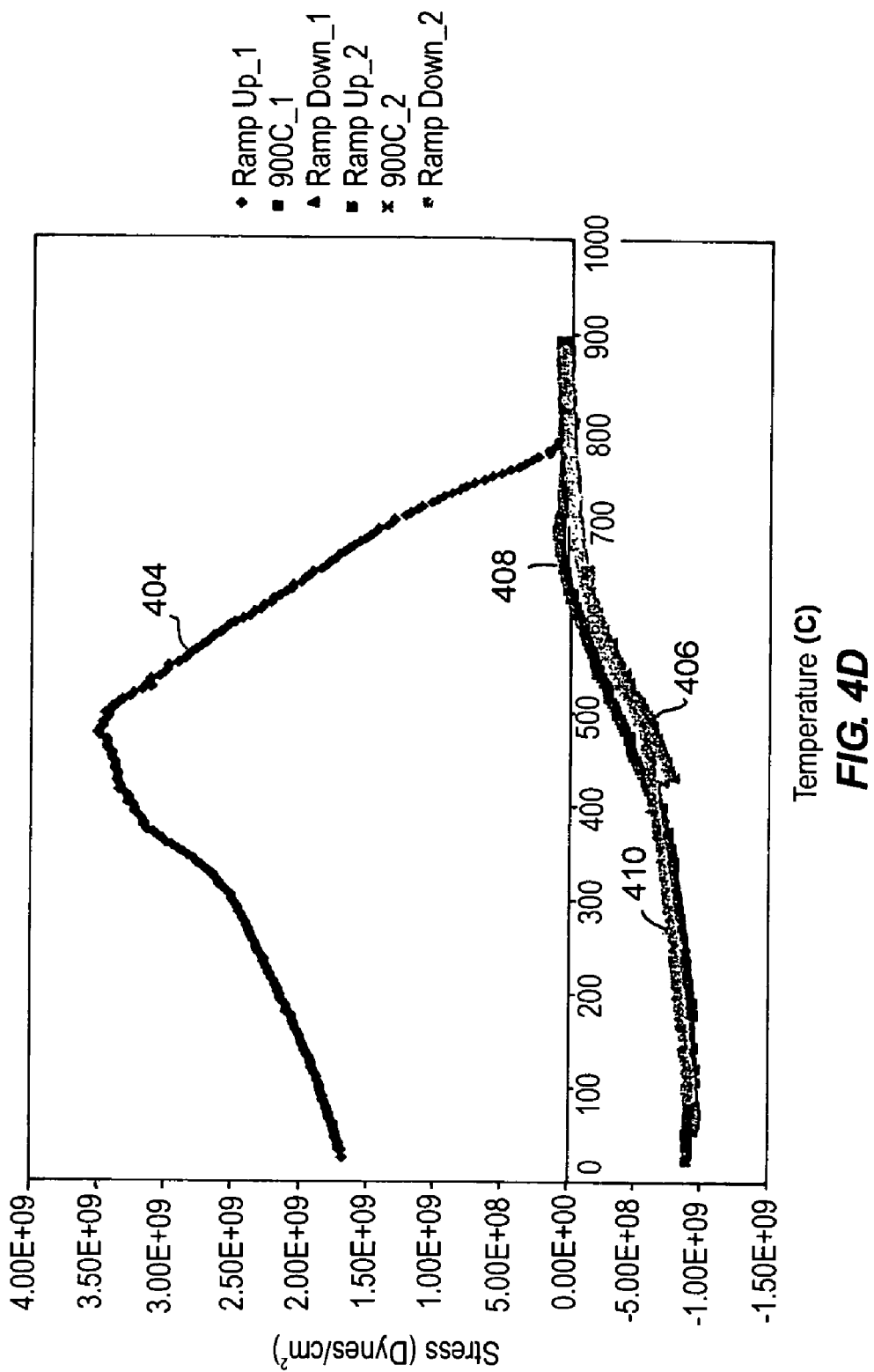
FIG. 4D is a graph showing the results of testing cladding layers for hysteretic effects during annealing.
Figure 4E:
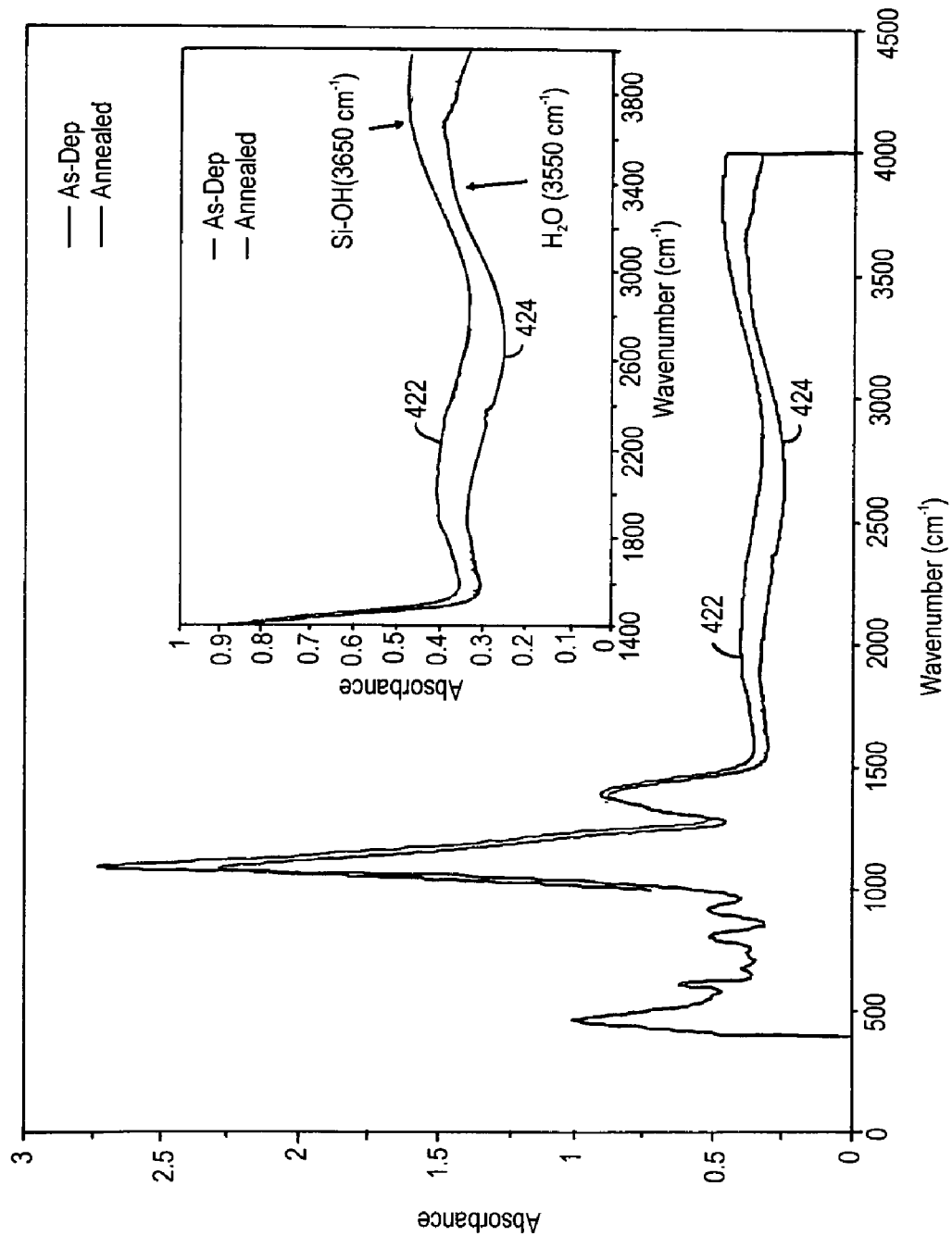
FIG. 4E is a graph showing the results of infrared spectroscopy measurements on cladding layers made according to embodiments of the invention.

FIGS. 4A–4C present the results of refractive-index measurements performed on BPSG layers deposited according to methods of the invention to determine whether there are systemic effects due to phosphorus concentration, boron concentration, thermal annealing, and thickness of the layers. The results indicate that the refractive index increases with phosphorus concentration, but is very little affected by differences in boron concentration. In addition, annealing of the layer systematically results in an increase in refractive index. In each case, the refractive index was measured using a standard prism technique at five distinct points on the layer, and averaging the results of the five measurements. The accuracy of the five-point measurement technique was confirmed by performing 79-point measurements on selected layers. The selected 79-point measurements showed good agreement with the five-point measurements. However, the decreasing difference in refractive index with increasing layer thickness seen between non-annealed and annealed layers in FIG. 4C is believed to be an artifact of the five-point measurement technique associated with thick films; when 79-point measurements were performed on both 2-μm and >15-μm films, they provided refractive-index values equal to the 2-μm results measured with the five-point measurement technique.

The specific effect of changing the phosphorus concentration on the refractive index is shown in FIG. 4A. The phosphorus concentration was varied between 0.0 wt. % and 9.0 wt. %. The refractive index was measured for each layer both before annealing and after annealing the layer in a $N_2$ atmosphere at 1050° C. for 60 minutes. In each instance, the boron concentration of the deposited layer was maintained at 2.0 wt. %. As shown in the figure, the pre-annealing results (triangles in FIG. 4A) show the refractive index increasing with increasing phosphorus concentration from a low of about 1.434 at [P]=0.0 wt. % to a high of about 1.466 at [P]=9.0 wt. %. Annealing caused an increase in refractive index and mitigated the phosphorus dependence to some extent. That is, for the after-annealing results (squares in FIG. 4A), the refractive index did not increase as rapidly with phosphorus concentration as did the pre-annealing results. An upper limit on phosphorus concentration was imposed by the effect of annealing since annealing caused the layers to crystallize in experiments where [P]>6.0 wt. %.

The effect of changing the boron concentration on the refractive index is shown in FIG. 4B. For these experiments, the phosphorus concentration was maintained at 2.0 wt. % and the boron concentration of the layer was varied between 3.0 wt. % and 6.0 wt. %. Each of the layers was annealed for 60 minutes at 1000° C. in an $O_2$ atmosphere. The pre-annealing results (diamonds in FIG. 4B) show a very weak dependence of the refractive index, increasing with boron concentration from a low of about 1.438 at [B]=3.0 wt. % to a high of about 1.439 at [B]=6.0 wt. %. This weak dependence disappears in the post-annealing results (squared in FIG. 4B), with the effect of annealing continuing to be manifested as an increase in refractive index. The increase in refractive index for a phosphorus concentration [P]=2.0 wt. % is equal to about 0.02, as confirmed by the results in both FIGS. 4A and 4B. The fact that the boron concentration may be varied without significantly affecting the refractive index is used as described below to achieve desired stress characteristics of deposited layers.

FIG. 4C illustrates the effect of increasing layer thickness on the refractive index. Both pre-annealing and post-annealing results are shown for three different sets of layers at different thicknesses. All of the layers had a boron concentration [B] of approximately 2.0 wt. % and a phosphorus concentration [P] of approximately 5.0 wt. %. Annealing was performed for approximately 60 minutes at 1050° C. in an $O_2$ atmosphere. As shown, the refractive index for the pre-anneal results is relatively constant with thickness. However, the post-anneal results show that the increase in refractive index caused by annealing is mitigated for greater layer thicknesses. While the pre- and post-anneal results show a difference in refractive index of about 0.018 at a thickness of about 2 µm, only about half that difference remains evident at a thickness of about 18 µm.

The stress of the deposited layers was evaluated both qualitatively and quantitatively. Qualitative evaluations including noting approximate thicknesses at which layers cracked, depending both on the composition of the layer and on the atmosphere in which the anneal was performed. These qualitative evaluations confirmed the expectation that stress is reduced with a larger boron concentration in the layer. In addition, it was found that the stress is also reduced by annealing in an $O_2$ atmosphere when compared with annealing either in a steam or $N_2$ atmosphere. For example, with layers having a boron concentration [B] of about 2.0 wt. % and a phosphorus concentration [P] of about 1.8 wt. %, cracking was observed at a thickness of about 8 µm when annealed in a steam atmosphere at 1050° C. for about 120 minutes and at about 13 µm when annealed in an $O_2$ atmosphere at 1050° C. for about 60 minutes. With layers having a boron concentration [B] of about 2.0 wt. % and a phosphorus concentration [P] of about 5.0 wt. %, cracking was observed at a thickness of about 8 µm when annealed in a $N_2$ atmosphere at 1050° C. for 60 minutes and showed no cracking even above 15 µm when annealed in an $O_2$ atmosphere at 1050° C. for 60 minutes. Scanning-electron-microscopy observations of the cracked layers confirmed that in each case the cracking occurred as a result of delamination in the last 2-µm layer added to the bulk layer.

These qualitative observations were confirmed quantitatively with stress-temperature measurements on 2-µm layers. An example of such measurements is provided in FIG. 4D for a layer having a boron concentration [B] of about 2.0 wt. % and a phosphorus concentration [P] of about 1.8 wt. %. Two annealing cycles were performed in a $N_2$ atmosphere. The first ramp-up to 900° C. is shown by data points 404, the first ramp-down by data points 406, the second ramp-up by data points 408 and the second ramp-down by data points 410. The maximum stress during the first cycle was $3.5 \times 10^9$ dynes/cm$^2$ and the post-anneal stress was about $-1.0 \times 10^9$ dynes/cm$^2$. In addition, the stress on the layer is stable since no stress hysteresis is observed after the first anneal cycle. Similar tests performed in a steam atmosphere for a 2-µm layer with [B]=2.0 wt. % and [P]=1.8 wt. % also showed no stress hysteresis, and produced a layer after the first cycle with a stress of $-5 \times 10^8$ dynes/cm$^2$, i.e. less compressive than provided with the $N_2$ atmosphere. The results of stress measurements for layers annealed in an $O_2$ atmosphere are discussed in detail with respect to the examples below.

The quality of the layers deposited according to methods of the invention was evaluated by using Fourier-transform infrared-spectroscopy to determine the extent of Si—OH and/or $H_2O$ bonding in the layers. Such bonding is a useful indicator of the presence of impurities in the layer and is useful as a point of comparison with PECVD processes, which are known to produce significant hydrogen impurities. No such bonding was observed, indicating that the layer quality is high and that the refractive index throughout the film should therefore be uniform. Exemplary pre- and post-annealing spectra are provided in FIG. 4E for layers having [B]=[P]=2.0 wt. %, with the annealing performed for 60 minutes at 1000° C. in an $O_2$ atmosphere. The pre-annealing spectrum is denoted 424 and the post-annealing spectrum is denoted 422. The presence of Si—OH bonding would be indicated by a peak at 3650 cm$^{-1}$ and the presence of $H_2O$ bonding would be indicated by a peak at 3350 cm$^{-1}$. No such peaks are seen in either spectrum, indicating that the layer quality is acceptable when the layers are deposited and that that quality is not adversely affected by the anneal.

3. EXAMPLES

The above discussion has described a number of general properties of layers deposited for optical-waveguide applications in accordance with embodiments of the invention. Such results may be used to derive specific deposition recipes for individual applications. Examples of suitable recipes developed using these properties are now described for a specific application in which the undercladding layer and/or uppercladding layer are expected to meet the following criteria: (1) have a refractive index substantially equal to 1.4575; (2) achieve a layer thickness greater than 15 µm; and (3) have a compressive stress less than 10$^9$ dynes/cm$^2$. Two illustrations are provided for BPSG in which 2-µm portions of the layers are successively deposited and annealed. In one of the illustrations, the boron concentration is [B]=5.0 wt. % and the phosphorus concentration is [P]=2.0 wt. %. In the other illustration, the boron concentration is [B]=6.0 wt. % and the phosphorus concentration is [P]=2.0 wt. %. The phosphorus concentration was chosen to provide the desired refractive index and the different boron concentrations were chosen to provide the desired stress characteristics when depositing layers having a thickness greater than 15 µm.

It is noted that these boron and phosphorus concentrations differ significantly from teachings regarding suitable BPSG concentrations available from premetal-dielectric ("PMD") applications. Such applications teach that it is desirable to keep the phosphorus concentration high because of its usefulness gettering atoms such as Na atoms. In particular, it is often believed desirable in such PMD applications for [B]+[P]≈10 wt. %. As discussed in detail above, such BPSG layers are unsuitable for the optical-waveguide applications described herein.

The following table sets forth suitable process parameters for the exemplary embodiments. It is to be understood that parameters presented in the table are, in part, chamber specific. Flow rates and other variables set forth herein have been determined for a GIGAFILL™ system, manufactured by APPLIED MATERIALS, INC., of Santa Clara, Calif., and configured for 200-mm substrates. Details of the chamber design and further discussion of the relevance of certain of the recited parameters are set forth below. The specified values may differ for chambers of other design and/or volume and the general process parameters may be scaled to substrates of different size, such as for 300-mm substrates.

TABLE I

Exemplary Process Parameters

| Process Parameter | Range | Value for [B] = 5.0 wt. % [P] = 2.0 wt. % | Value for [B] = 6.0 wt. % [P] = 2.0 wt. % |
|---|---|---|---|
| $\mathcal{F}$(TEOS) (mgm) | 400–1200 | 600 | 600 |
| $\mathcal{F}$(TEB) (mgm) | 10–500 | 204 | 254 |
| $\mathcal{F}$(TEPO) (mgm) | 10–100 | 11 | 14 |
| $\mathcal{F}$(He) (sccm) | 4000–8000 | 6000 | 6000 |
| $\mathcal{F}$(O$_3$) (sccm) | 2000–6000 | 4000 | 4000 |
| [O$_3$] (wt. %) | 10–15 | 12.5 | 12.5 |
| Temperature (° C.) | 300–600 | 480 | 480 |
| Pressure (torr) | 100–800 | 200 | 200 |
| Substrate-Manifold Spacing (mils) | 200–300 | 220 | 220 |
| Deposition Time per cycle (s) | 300–400 | 386 | 338 |
| Anneal Atmosphere | O$_2$ | O$_2$ | O$_2$ |
| Anneal Temperature (° C.) | 900–1050 | 1000 | 1000 |

In the examples summarized in Table I, TEOS, TEB, and TEPO are used respectively as the sources of silicon, boron, and phosphorus, and O$_3$ is used as the source of oxygen. The liquid TEOS, TEB, and TEPO sources are bubble vaporized and mixed with a helium carrier gas. The O$_3$ actually comprises a mixture of O$_3$ and O$_2$ that is produced with an ozone generator, which is why the table provides both an O$_3$ flow rate F(O$_3$) and an O$_3$ concentration [O$_3$]. The substrate is spaced from the gas distribution manifold to confine the reactant gases between the substrate and manifold to increase reaction efficiency and to confine deposition of material to the surface of the substrate.

The resulting properties of films deposited with the specific parameters shown in Table I were subsequently measured. The results of such measurements are summarized in the table below and in FIGS. 5A–6B.

TABLE II

Measured Properties of Deposited Layers

| Measured Property | Value for nominal layer [B] = 5.0 wt. % [P] = 2.0 wt. % | Value for nominal layer [B] = 6.0 wt. % [P] = 2.0 wt. % |
|---|---|---|
| Thickness (Å) | 19,800 | 19,520 |
| [B] (wt. %) | 4.903 | 6.058 |
| [P] (wt. %) | 1.958 | 2.058 |

Figure 5A:
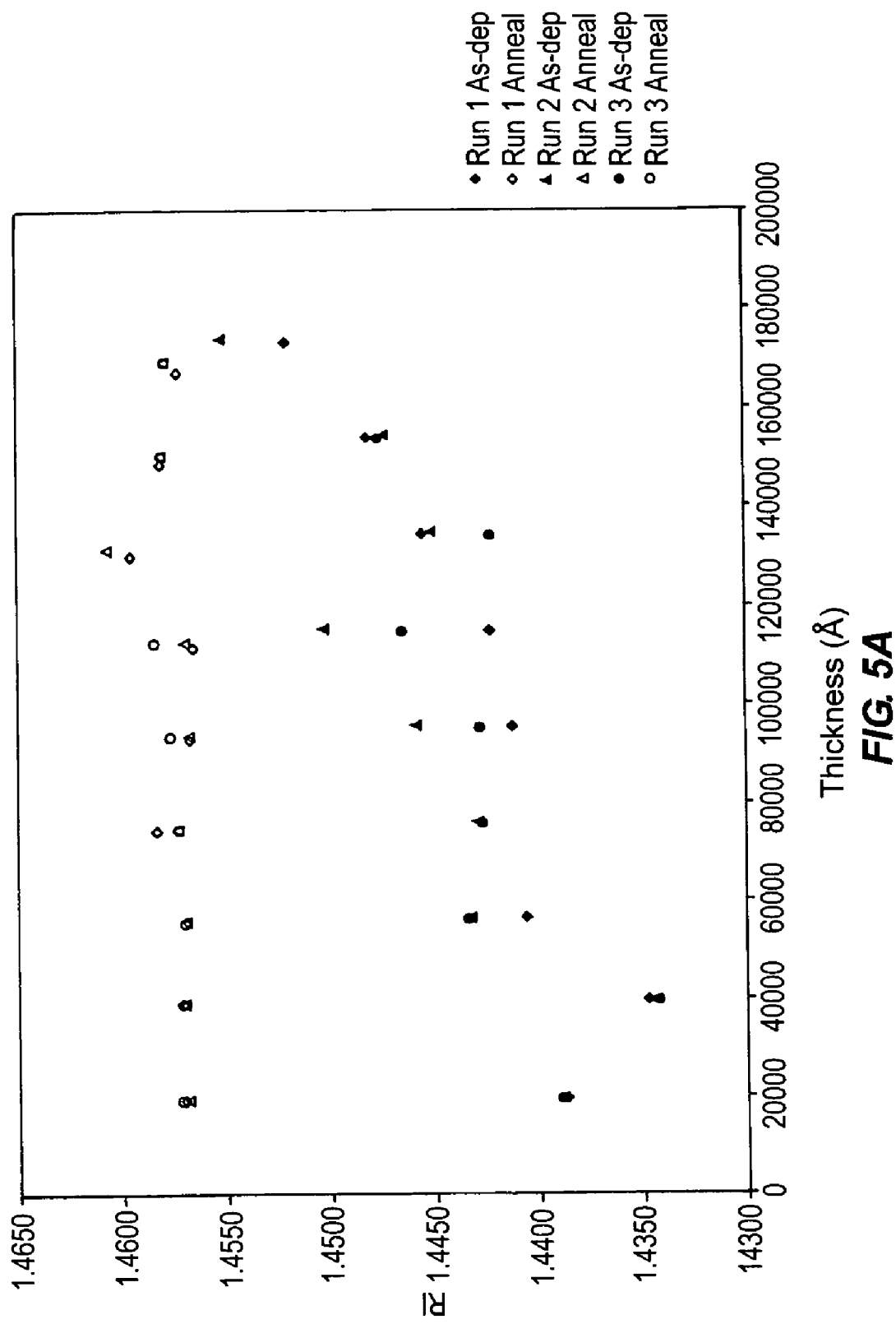
FIG. 5A is a graph showing the refractive index for BPSG cladding layers having a boron concentration of about 5 wt. % and a phosphorus concentration of about 2 wt. %.
Figure 5B:
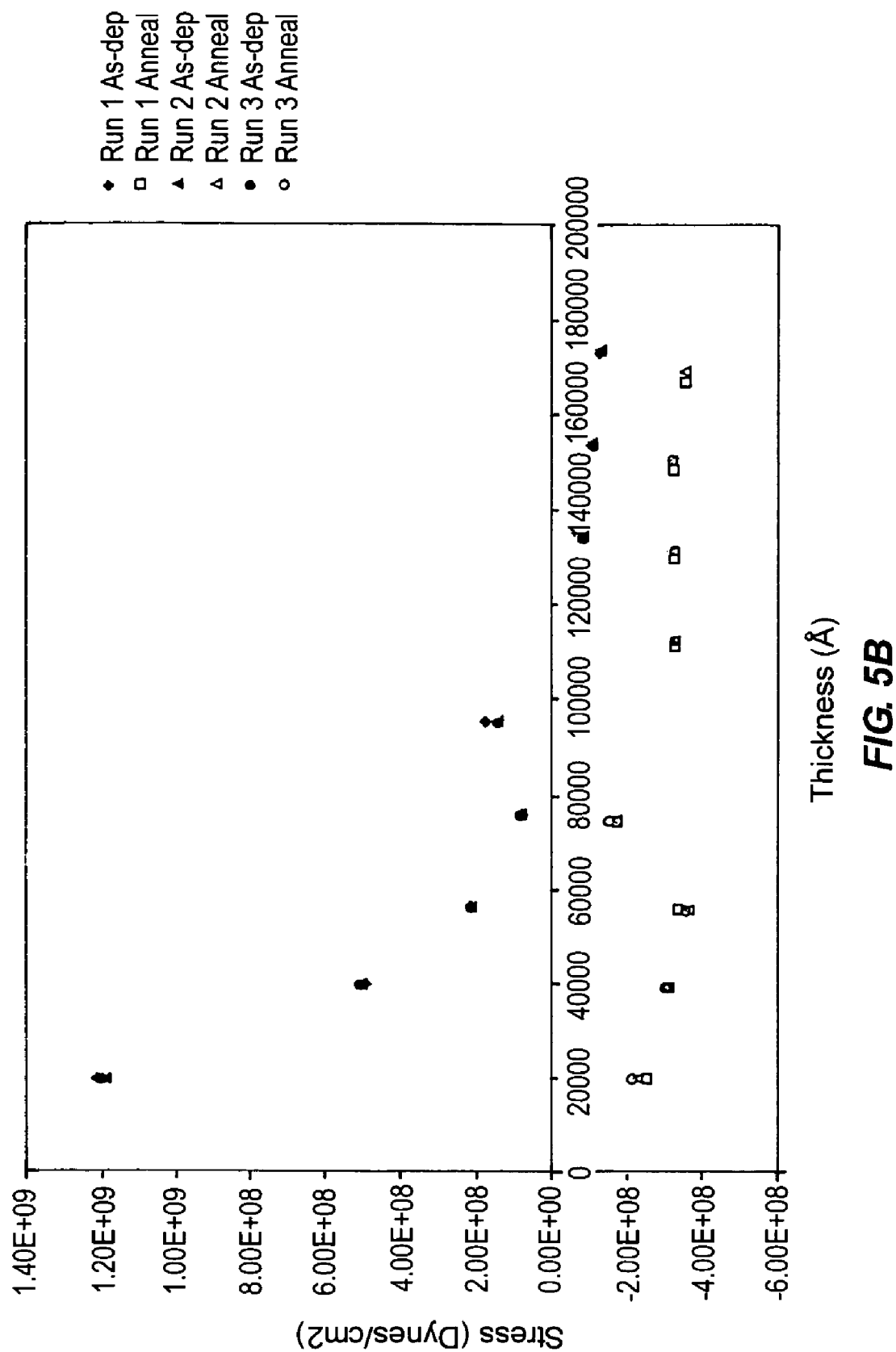
FIG. 5B is a graph showing the stress for BPSG cladding layers having a boron concentration of about 5 wt. % and a phosphorus concentration of about 2 wt. %.
Figure 5C:
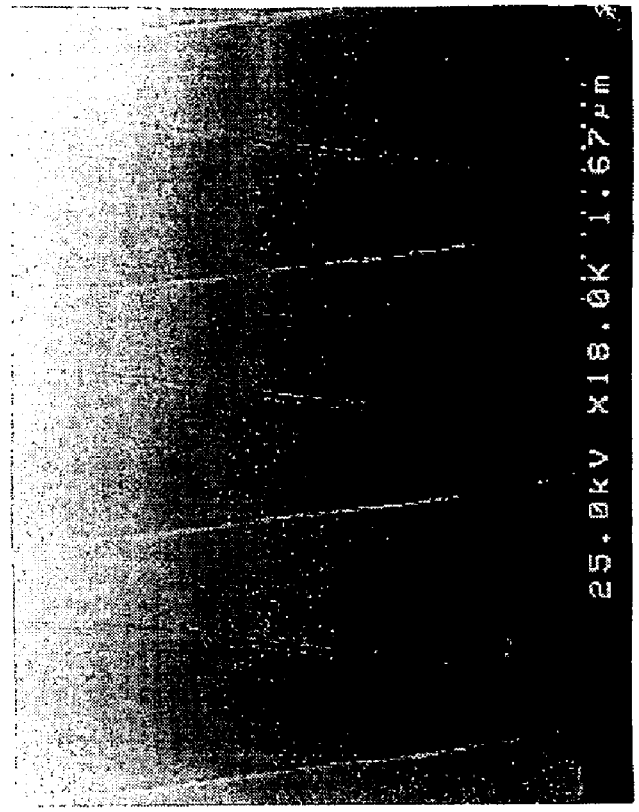
FIG. 5C is a micrograph showing good gapfill characteristics with cladding layers made according to embodiments of the invention.
Figure 5C:
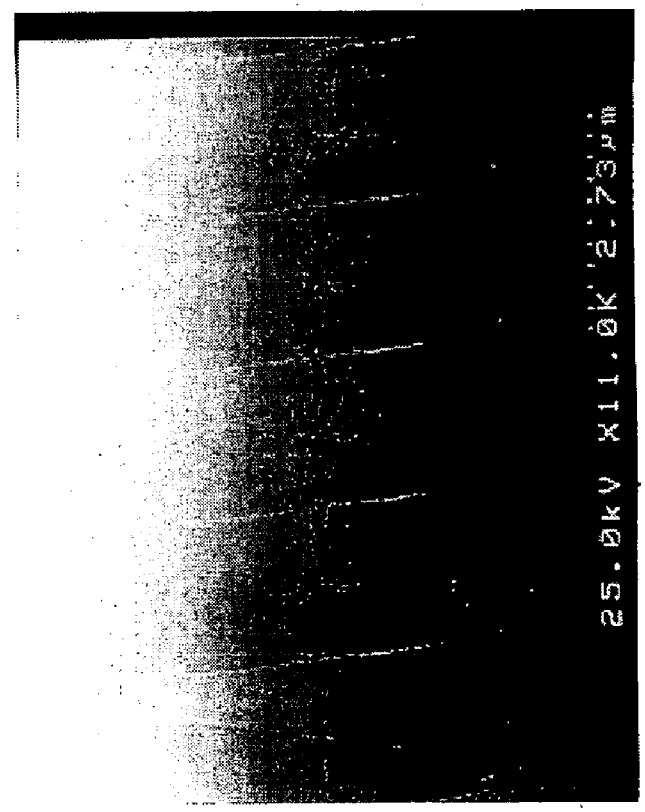

FIGS. 5A–5C show results for the layers having [B]=5.0 wt. % and [P]=2.0 wt. %. In FIGS. 5A and 5B, the refractive index and stress are shown as functions of layer thickness for three separate sample runs, both as-deposited and after annealing for 60 minutes at 1000° C. in an O$_2$ atmosphere. In FIG. 5A, the as-deposited results for the three runs are shown with solid diamonds, triangles, and circles, while the after-annealing results are shown with open diamonds, triangles, and circles. The general trends discussed above have been used to produce layers of increasing thickness that have the desired refractive index. In particular, the systemic decrease in amount by which annealing increases the refractive index as the layer thickness increases has been exploited. Accordingly, the refractive index is consistently seen to be within about 2% of the desired value of RI=1.4575.

The results of stress measurements in FIG. 5B are shown with solid diamonds, triangles, and circles for the as-deposited layers and with open squares, triangles, and circles for the layers after annealing. The effect of annealing is apparent, producing layers that are weakly compressive. In particular, the stress of the layers after annealing is compressive and less than $4 \times 10^8$ dynes/cm$^2$, well within the desired parameters.

FIG. 5C shows micrographs illustrating the gapfill characteristics of the methods. Complete gapfill was achieved by initially depositing and annealing a 5-kÅ layer, followed by two deposition/annealing cycles of 10-kÅ layers. The right panel shows the result after the first 10-kÅ deposition and the left panel shows the result after the second 10-kÅ deposition. Similar results are achieved with deposition successive deposition of 2.0–3.0 μm layers. The conformal nature of the deposition using the methods described is also visible in the figures.

Figure 6A:
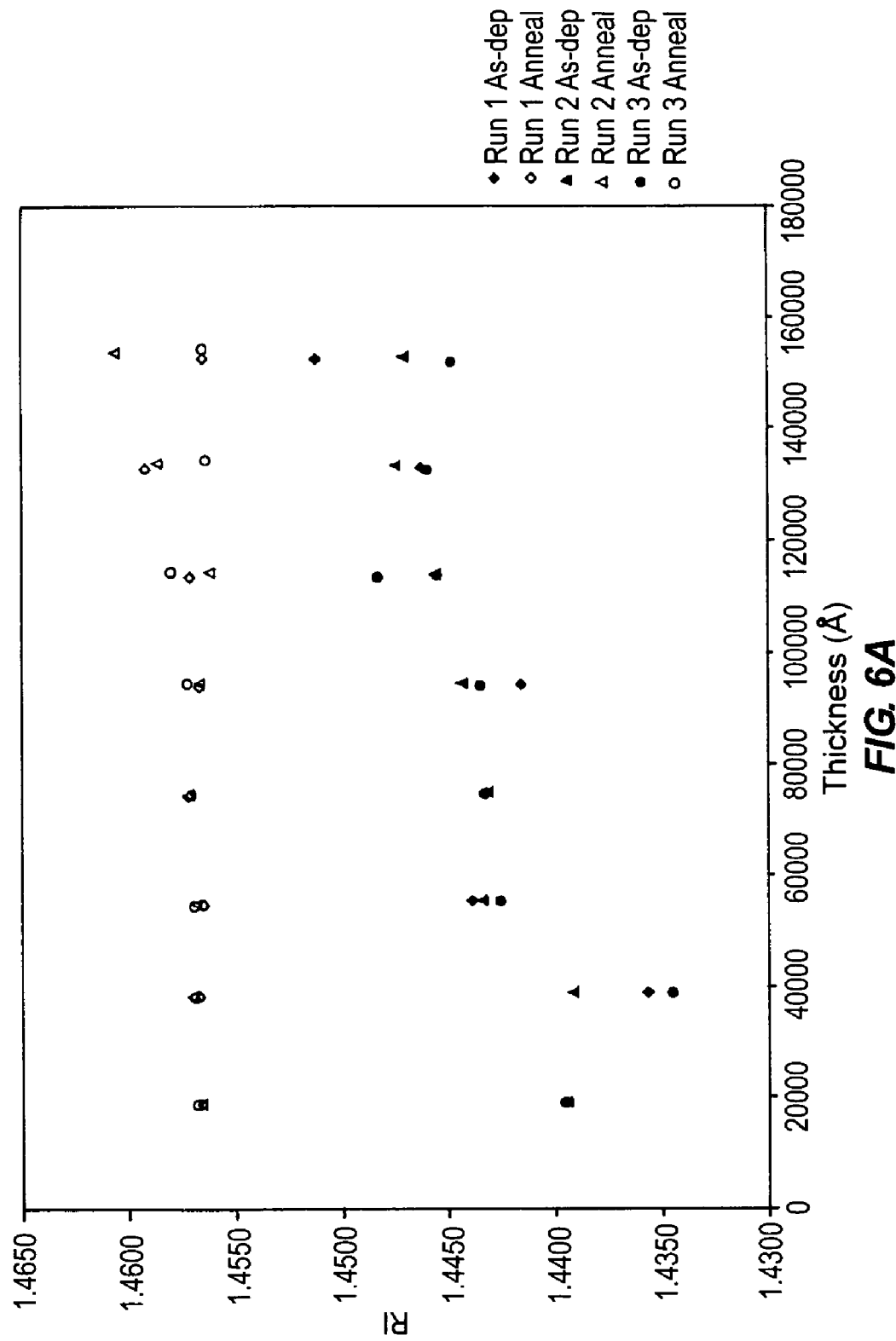
FIG. 6A is a graph showing the refractive index for BPSG cladding layers having a boron concentration of about 6 wt. % and a phosphorus concentration of about 2 wt. %.
Figure 6B:
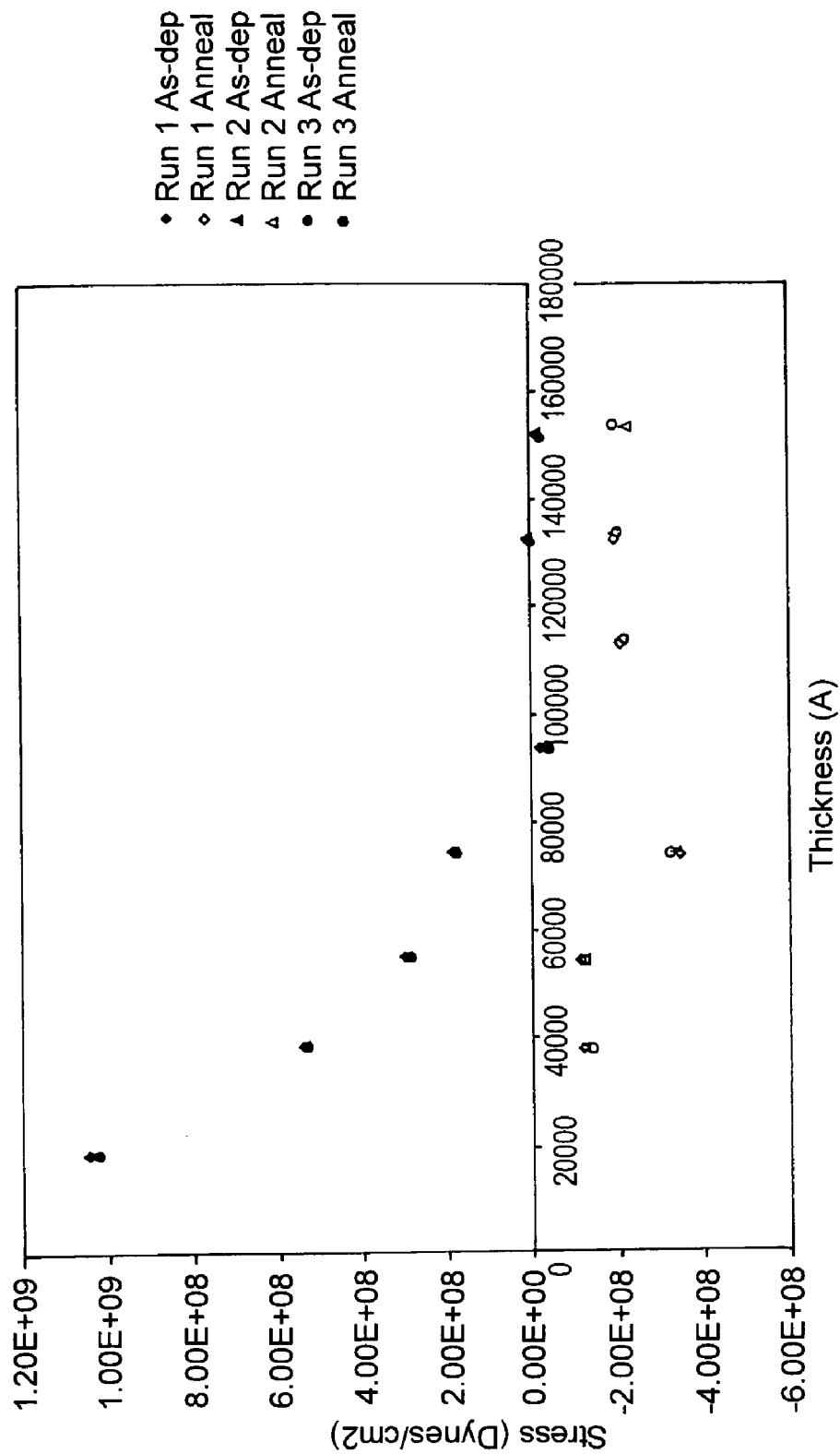
FIG. 6B is a graph showing the stress for BPSG cladding layers having a boron concentration of about 6 wt. % and a phosphorus concentration of about 2 wt. %.

The results shown in FIGS. 6A and 6B parallel those shown for FIGS. 5A and 5B, except that layers having [B]=6.0 wt. % and [P]=2.0 wt. % are deposited and annealed. Results for the refractive index before annealing are shown in FIG. 6A with solid diamonds, triangles, and circles, and results after annealing are shown with open diamonds, triangles, and circles. Similar to the results of FIG. 5A, the decreasing effect with layer thickness of annealing on refractive index has been exploited to produce layers that differ from the desired refractive index by less than about 2%, even at layer thicknesses that exceed 15 μm.

The stress shown for the layers in FIG. 6B is also considerably lower than the desired parameters. The results for as-deposited layers are shown with solid diamonds, triangles, and circles, and results for annealed layers are shown with open diamonds, triangles, and circles. After annealing the stress is compressive and generally even lower than for layers having a boron concentration of 5.0 wt. %. The stress is as low as $2 \times 10^8$ dynes/cm$^2$ in most instances.

These examples accordingly confirm that the methods of the invention may be used in certain embodiments to achieve desirable properties for undercladding and uppercladding layers in optical-waveguide structures. Narrowly constrained refractive indices are achieved simultaneously with low compressive stress, even for layers having thicknesses exceeding 15 µm.

4. Exemplary Thermal Chemical-Vapor Deposition System

Figure 7A:
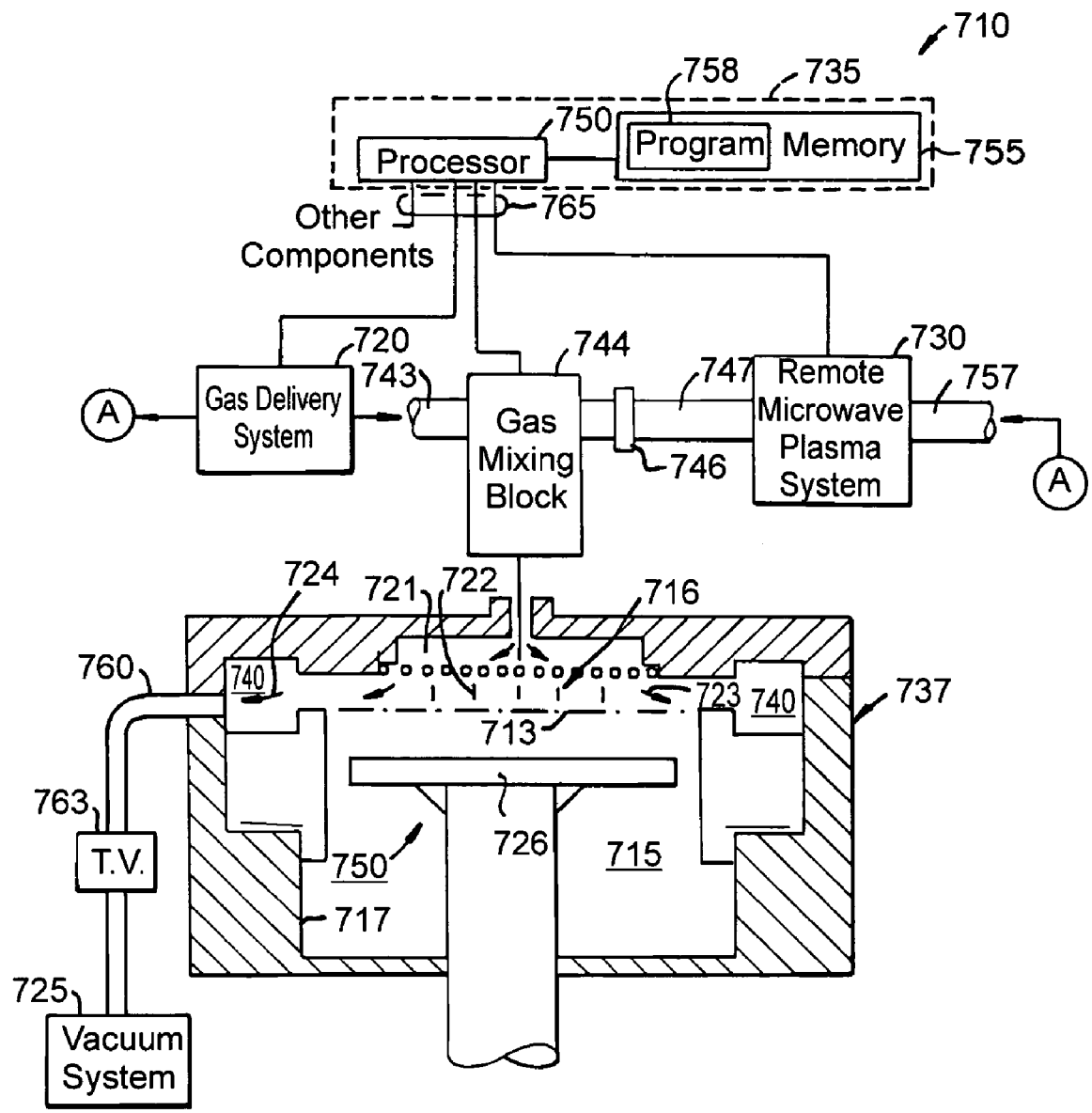
FIG. 7A is a simplified representation of an exemplary CVD apparatus that can be used to practice the method of the present invention.

FIG. 7A is a simplified diagram of an exemplary chemical vapor deposition ("CVD") system 710 in which the methods of the present invention can be practiced. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 715 that receives process and other gases from a gas delivery system 720, a vacuum system 725, a remote plasma system 730, and a control system 735. These and other components are described in more detail below.

CVD apparatus 710 includes an enclosure assembly 737 that forms vacuum chamber 715 with a gas reaction area 716. A gas distribution plate 721 disperses reactive gases and other gases, such as purge gases, through perforated holes toward a wafer (not shown) that rests on a vertically movable heater 726 (also referred to as a wafer support pedestal). Between gas distribution plate 721 and the wafer is gas reaction area 716. Heater 726 can be controllably moved between a lower position, where a wafer can be loaded or unloaded, for example, and a processing position closely adjacent to the gas distribution plate 721, indicated by a dashed line 713, or to other positions for other purposes, such as for an etch or cleaning process. A center board (not shown) includes sensors for providing information on the position of the wafer.

Heater 726 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of heater 726 exposed to vacuum chamber 715 are made of a ceramic material, such as aluminum oxide ($Al_2O_3$ or alumina) or aluminum nitride.

Reactive and carrier gases are supplied from gas delivery system 720 through supply lines 743 into a gas mixing box (also called a gas mixing block) 744, where they are mixed together and delivered to gas distribution plate 721. Gas delivery system 720 includes a variety of gas sources and appropriate supply lines to deliver a selected amount of each source to chamber 715 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 710, some of the sources may actually be liquid sources, such as TEOS, TEB and/or TEPO, rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. Gas delivery system may also include an ozone generator to generate ozone from a supply of molecular oxygen when ozone is required by a process run on system 710.

Gas mixing box 744 is a dual input mixing block coupled to process gas supply lines 743 and to a cleaning/etch gas conduit 747. A valve 746 operates to admit or seal gas or plasma from gas conduit 747 to gas mixing block 744. Gas conduit 747 receives gases from an integral remote microwave plasma system 730, which has an inlet 757 for receiving input gases. During deposition processing, gas supplied to the plate 721 is vented toward the wafer surface (as indicated by arrows 723), where it may be uniformly distributed radially across the wafer surface in a laminar flow.

Purging gas may be delivered into the vacuum chamber 715 from gas distribution plate 721 and/or from inlet ports or tubes (not shown) through the bottom wall of enclosure assembly 737. Purge gas introduced from the bottom of chamber 715 flows upward from the inlet port past the heater 726 and to an annular pumping channel 740. Vacuum system 725 which includes a vacuum pump (not shown), exhausts the gas (as indicated by arrows 724) through an exhaust line 760. The rate at which exhaust gases and entrained particles are drawn from the annular pumping channel 740 through the exhaust line 760 is controlled by a throttle valve system 763.

Remote microwave plasma system 730 can produce a plasma for selected applications, such as chamber cleaning or etching native oxide or residue from a process wafer. Plasma species produced in the remote plasma system 730 from precursors supplied via the input line 757 are sent via the conduit 747 for dispersion through gas distribution plate 720 to vacuum chamber 715. Remote microwave plasma system 730 is integrally located and mounted below chamber 715 with conduit 747 coming up alongside the chamber to gate valve 746 and gas mixing box 744, which is located above chamber 715. Precursor gases for a cleaning application may include fluorine, chlorine and/or other reactive elements. Remote microwave plasma system 730 may also be adapted to deposit CVD layers flowing appropriate deposition precursor gases into remote microwave plasma system 730 during a layer deposition process.

The temperature of the walls of deposition chamber 715 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. Gas distribution manifold 721 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 735 controls activities and operating parameters of the deposition system. System controller 735 includes a computer processor 750 and a computer-readable memory 755 coupled to processor 750. Processor 750 executes system control software, such as a computer program 758 stored in memory 770. Memory 770 is preferably a hard disk drive but may be other kinds of memory, such as read-only memory or flash memory. System controller 735 also includes a floppy disk drive (not shown).

Processor 750 operates according to system control software (program 753), which includes computer instructions that dictate the timing, mixture of gases, chamber pressure, chamber temperature, microwave power levels, pedestal position, and other parameters of a particular process. Control of these and other parameters is effected over control lines 765, only some of which are shown in FIG. 1A, that communicatively couple system controller 735 to the heater, throttle valve, remote plasma system and the various valves and mass flow controllers associated with gas delivery system 720.

Processor 750 has a card rack (not shown) that contains a single-board computer, analog and digital input/output boards, interface boards and stepper motor controller boards. Various parts of the CVD system 710 conform to the Versa Modular European (VME) standard which defines board, card cage, and connector dimensions and types. The VME standard also defines the bus structure having a 16-bit data bus and 24-bit address bus.

Figure 7B:
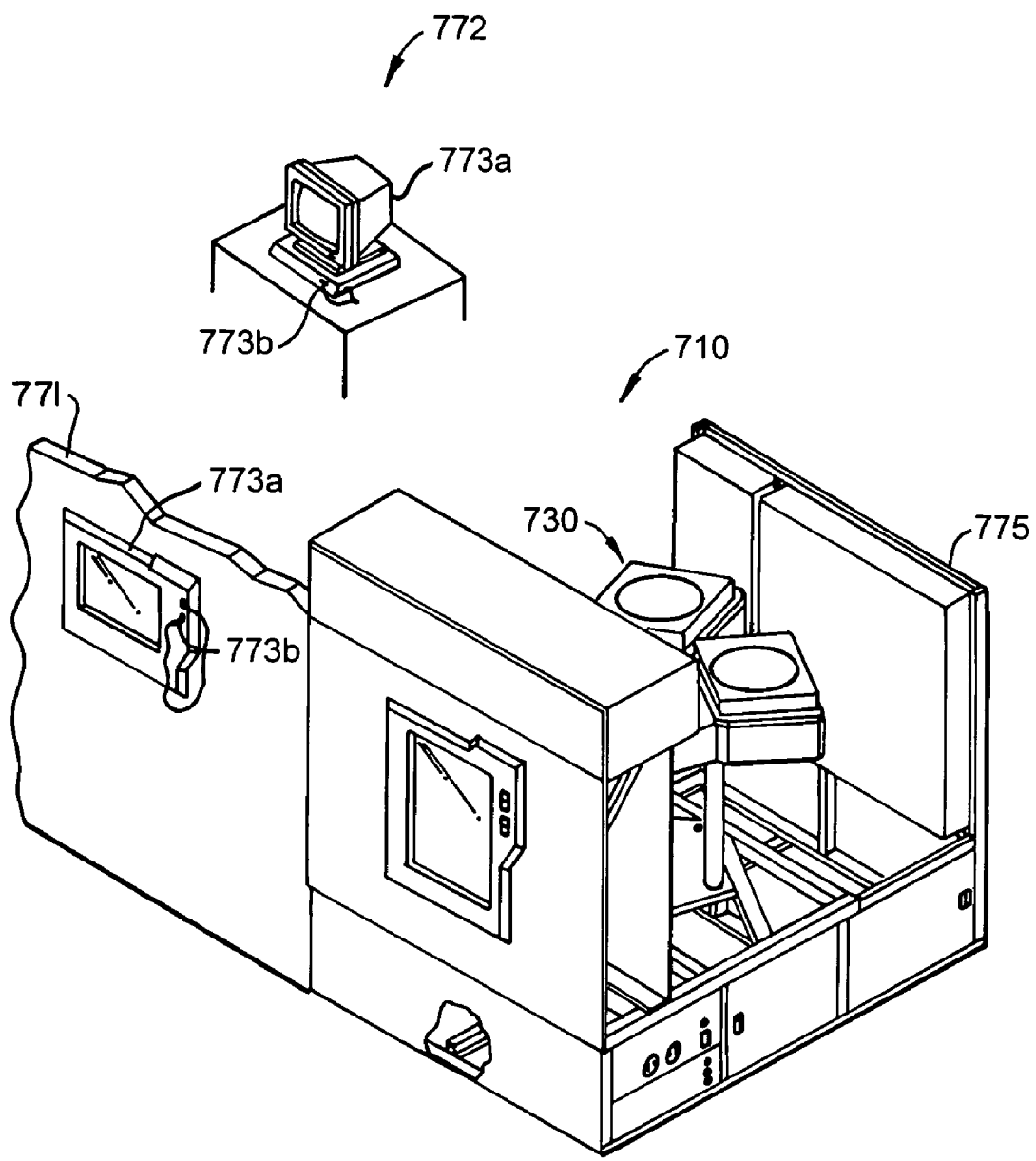
FIG. 7B is a simplified representation of one embodiment of a user interface for the exemplary CVD apparatus of FIG. 1A.

FIG. 7B is a simplified diagram of a user interface that can be used to monitor and control the operation of CVD system 710. As shown in FIG. 7B, CVD system 710 may be one chamber of a multichamber substrate processing system. In such a multichamber system wafers may be transferred from one chamber to another via a computer-controlled robot for additional processing. In some cases the wafers are transferred under vacuum or a selected gas. The interface between a user and system controller 735 is a CRT monitor 773a and a light pen 773b. A mainframe unit 775 provides electrical, plumbing, and other support functions for the CVD apparatus 710. Exemplary multichamber system mainframe units compatible with the illustrative embodiment of the CVD apparatus are currently commercially available as the Precision 5000™ and the Centura 5200™ systems from APPLIED MATERIALS, INC. of Santa Clara, Calif.

In the preferred embodiment two monitors 773a are used, one mounted in the clean room wall 771 for the operators, and the other behind the wall 772 for the service technicians. Both monitors 773a simultaneously display the same information, but only one light pen 773b is enabled. The light pen 773b detects light emitted by the CRT display with a light sensor in the tip of the pen. To select a particular screen or function, the operator touches a designated area of the display screen and pushes the button on the pen 773b. The touched area changes its highlighted color, or a new menu or screen is displayed, confirming communication between the light pen and the display screen. As a person of ordinary skill would readily understand, other input devices, such as a keyboard, mouse, or other pointing or communication device, may be used instead of or in addition to the light pen 773b to allow the user to communicate with the processor.

Figure 7C:
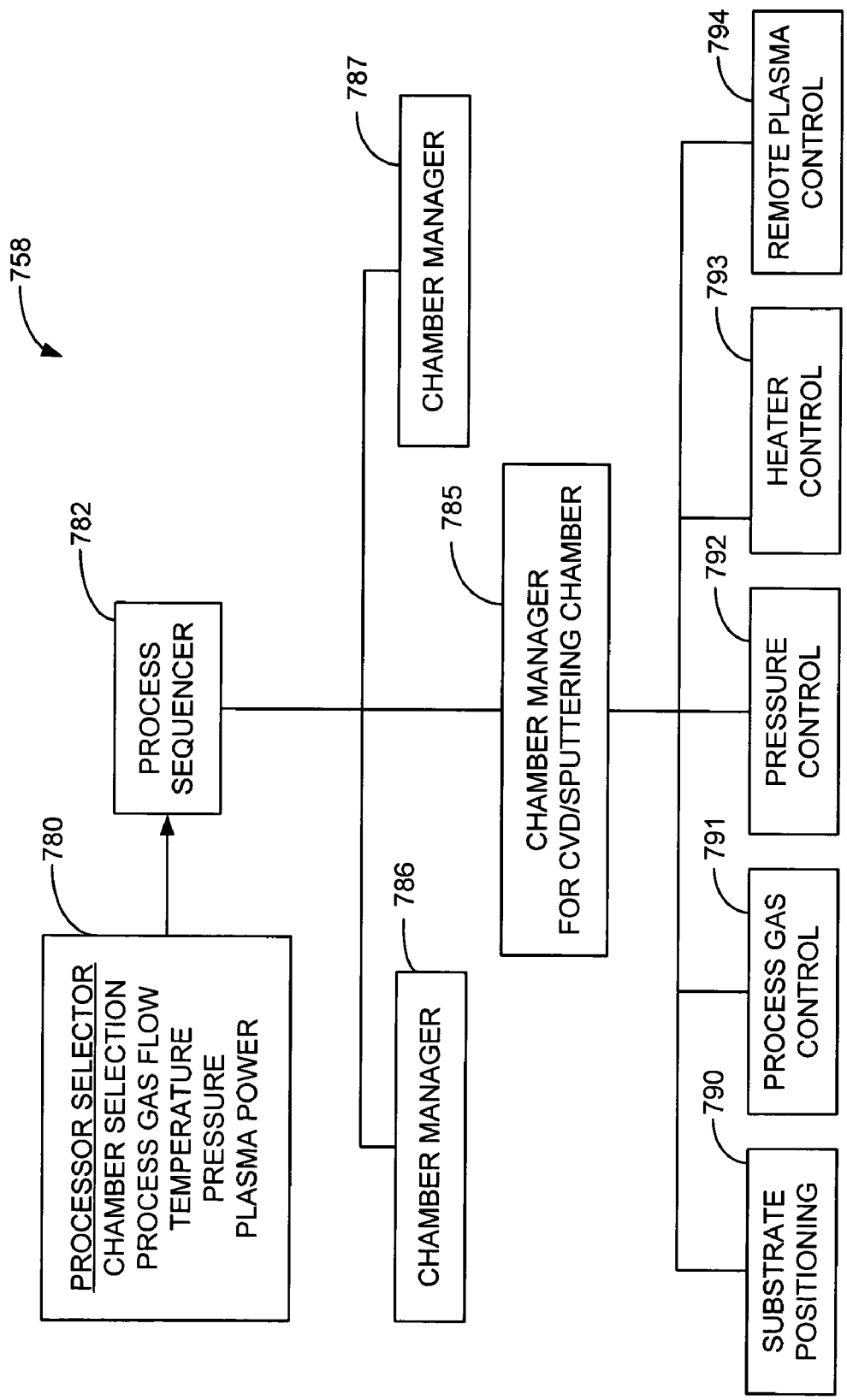
FIG. 7C is a block diagram of one embodiment of the hierarchical control structure of the system control software for the exemplary CVD apparatus of FIG. 1A.

FIG. 7C is a block diagram of one embodiment of the hierarchical control structure of the system control software, computer program 758, for the exemplary CVD apparatus of FIG. 7A. Processes such as those for depositing a layer, performing a dry chamber clean, or performing reflow or drive-in operations can be implemented under the control of computer program 758 that is executed by processor 750. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 780 by using the light pen to select a choice provided by menus or screens displayed on the CRT monitor. The process sets, which are predetermined sets of process parameters necessary to carry out specified processes, are identified by predefined set numbers. The process selector subroutine 780 identifies (i) the desired process chamber, and (ii) the desired set of process parameters needed to operate the process chamber for performing the desired process. The process parameters for performing a specific process relate to process conditions such as, for example, process gas composition and flow rates, pedestal temperature, chamber wall temperature, pressure and plasma conditions such as magnetron power levels. The process selector subroutine 780 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 782 has program code for accepting the identified process chamber and process parameters from the process selector subroutine 780, and for controlling the operation of the various process chambers. Multiple users can enter process set numbers and process chamber numbers, or a single user can enter multiple process set numbers and process chamber numbers, so process sequencer subroutine 782 operates to schedule the selected processes in the desired sequence. Preferably, process sequencer subroutine 782 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, process sequencer subroutine 782 can be designed to take into consideration the present condition of the process chamber being used in comparison with the desired process conditions for a selected process, or the "age" of each particular user-entered request, or any other relevant factor a system programmer desires to include for determining scheduling priorities.

Once process sequencer subroutine 782 determines which process chamber and process set combination is going to be executed next, process sequencer subroutine 782 initiates execution of the process set by passing the particular process set parameters to a chamber manager subroutine 785 which controls multiple processing tasks in a particular process chamber according to the process set determined by process sequencer subroutine 782. For example, chamber manager subroutine 785 has program code for controlling CVD and cleaning process operations in chamber 715. Chamber manager subroutine 785 also controls execution of various chamber component subroutines which control operation of the chamber components necessary to carry out the selected process set. Examples of chamber component subroutines are substrate positioning subroutine 790, process gas control subroutine 791, pressure control subroutine 792, heater control subroutine 793 and remote plasma control subroutine 794. Depending on the specific configuration of the CVD chamber, some embodiments include all of the above subroutines, while other embodiments may include only some of the subroutines or other subroutines not described. Those having ordinary skill in the art would readily recognize that other chamber control subroutines can be included depending on what processes are to be performed in the process chamber. In multichamber systems, additional chamber manager subroutines 786, 787 control the activities of other chambers.

In operation, the chamber manager subroutine 785 selectively schedules or calls the process component subroutines in accordance with the particular process set being executed. Chamber manager subroutine 785 schedules the process component subroutines much like the process sequencer subroutine 782 schedules which process chamber and process set are to be executed next. Typically, chamber manager subroutine 785 includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 7A and 7C. The substrate positioning subroutine 790 comprises program code for controlling chamber components that are used to load the substrate onto the heater 726 and, optionally, to lift the substrate to a desired height in the chamber to control the spacing between the substrate and the gas distribution manifold 721. When a substrate is loaded into the process chamber 715, the heater 726 is lowered to receive the substrate and then the heater 726 is raised to the desired height. In operation, the substrate positioning subroutine 790 controls movement of the heater 726 in response to process set parameters related to the support height that are transferred from the chamber manager subroutine 785.

Process gas control subroutine 791 has program code for controlling process gas composition and flow rates. Process gas control subroutine 791 controls the state of safety shut-off valves, and also ramps the mass flow controllers up or down to obtain the desired gas flow rate. Typically, process gas control subroutine 791 operates by opening the gas supply lines and repeatedly (i) reading the necessary mass flow controllers, (ii) comparing the readings to the desired flow rates received from the chamber manager subroutine 785, and (iii) adjusting the flow rates of the gas supply lines as necessary. Furthermore, process gas control subroutine 791 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 791 is programmed to include steps for flowing the inert gas into the chamber for an amount of time necessary to stabilize the pressure in the chamber, and then the steps described above would be carried out. Additionally, when a process gas is to be vaporized from a liquid precursor, such as TEOS, TEPO, or TEB, process gas control subroutine 791 is written to include steps for bubbling a delivery gas such as helium through the liquid precursor in a bubbler assembly, or controlling a liquid injection system to spray or squirt liquid into a stream of carrier gas, such as helium. When a bubbler is used for this type of process, process gas control subroutine 791 regulates the flow of the delivery gas, the pressure in the bubbler, and the bubbler temperature in order to obtain the desired process gas flow rates. As discussed above, the desired process gas flow rates are transferred to process gas control subroutine 791 as process parameters.

Furthermore, process gas control subroutine 791 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 792 includes program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 792 is invoked, the desired or target pressure level is received as a parameter from the chamber manager subroutine 785. Pressure control subroutine 792 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values. Alternatively, the pressure control subroutine 792 can be written to open or close the throttle valve to a particular aperture size, i.e. a fixed position, to regulate the pressure in the chamber. Controlling the exhaust capacity in this way does not invoke the feedback control feature of the pressure control subroutine 792.

Heater control subroutine 793 includes program code for controlling the current to a heating unit that is used to heat the substrate. Heater control subroutine 793 is also invoked by the chamber manager subroutine 785 and receives a target, or set-point, temperature parameter. Heater control subroutine 793 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. Heater control subroutine 793 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

Remote plasma control subroutine 794 includes program code to control the operation of remote plasma system 730. Plasma control subroutine 794 is invoked by chamber manager 785 in a manner similar to the other subroutines just described.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, is software, hardware or both. Those skilled in the art will also realize that it would be a matter of routine skill to select an appropriate computer system to control CVD system 710.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method for forming an optical waveguide, the method comprising:
providing a gaseous mixture to a chamber at a pressure substantially between 100 torr and 800 torr;
depositing an undercladding layer over a substrate with the gaseous mixture using thermal chemical-vapor deposition, wherein depositing the undercladding layer comprises:
depositing a first portion of the undercladding layer using thermal chemical-vapor deposition;
thermally annealing the first portion; and
thereafter, depositing a second portion of the undercladding layer using thermal chemical-vapor deposition; and
forming a plurality of optical cores over the deposited undercladding layer, wherein the optical cores have a refractive index greater than a refractive index of the undercladding layer.

2. The method recited in claim 1 wherein the gaseous mixture comprises a boron-containing gas, a phosphorus-containing gas, a silicon-containing gas, and an oxygen-containing gas, and the undercladding layer comprises a borophosphosilicate-glass layer.

3. The method recited in claim 2 wherein a boron concentration of the undercladding layer is substantially between 3 wt. % and 8 wt. %.

4. The method recited in claim 2 wherein a boron concentration of the undercladding layer is substantially between 4.5 wt. % and 6.5 wt. %.

5. The method recited in claim 2 wherein a phosphorus concentration of the undercladding layer is substantially between 1 wt. % and 3 wt. %.

6. The method recited in claim 1 wherein the pressure is substantially between 100 torr and 300 torr.

7. The method recited in claim 1 wherein thermally annealing the first portion is performed in a nitrogen atmosphere.

8. The method recited in claim 1 wherein thermally annealing the first portion is performed in an oxygen atmosphere.

9. The method recited in claim 1 wherein thermally annealing the first portion is performed without removing the substrate from the chamber.

10. The method recited in claim 1 wherein thermally annealing the first portion is performed at a temperature substantially between 900° C. and 1050° C.

11. The method recited in claim 1 further comprising depositing an uppercladding layer over the optical cores substrate using thermal chemical-vapor deposition.

12. The method recited in claim 1 wherein the refractive index of the undercladding layer is between 1.4500 and 1.4650.

13. The method recited in claim 1 wherein the refractive index of the undercladding layer is between 1.4550 and 1.4600.

14. The method recited in claim 1 wherein the refractive index of the undercladding layer varies by less than 2% of 1.4575.

15. A method for forming an optical waveguide, the method comprising:
providing a gaseous mixture to a chamber at a pressure substantially between 100 torr and 800 torr; and
depositing an uppercladding layer over a substrate having a plurality of optical cores with the gaseous mixture using thermal chemical-vapor deposition, wherein the optical cores have a refractive index greater than a refractive index of the uppercladding layer, wherein depositing the uppercladding layer comprises:
depositing a first portion of the uppercladding layer using thermal chemical-vapor deposition;

thermally annealing the first portion; and thereafter, depositing a second portion of the uppercladding layer using thermal chemical vapor deposition.

16. The method recited in claim 15 wherein the gaseous mixture comprises a boron-containing gas, a phosphorus-containing gas, a silicon-containing gas, and an oxygen-containing gas, and the uppercladding layer comprises a borophosphosilicate-glass layer.

17. The method recited in claim 16 wherein a boron concentration of the uppercladding layer is substantially between 3 wt. % and 8 wt. %.

18. The method recited in claim 16 wherein a boron concentration of the uppercladding layer is substantially between 4.5 wt. % and 6.5 wt. %.

19. The method recited in claim 16 wherein a phosphorus concentration of the uppercladding layer is substantially between 1 wt. % and 3 wt. %.

20. The method recited in claim 15 wherein the pressure is substantially between 100 torr and 300 torr.

21. The method recited in claim 15 wherein thermally annealing the first portion is performed in a nitrogen atmosphere.

22. The method recited in claim 15 wherein thermally annealing the first portion is performed in an oxygen atmosphere.

23. The method recited in claim 15 wherein thermally annealing the first portion is performed without removing the substrate from the chamber.

24. The method recited in claim 15 wherein thermally annealing the first portion is performed at a temperature substantially between 900° C. and 1050° C.

25. The method recited in claim 15 wherein the refractive index of the uppercladding layer is between 1.4500 and 1.4650.

26. The method recited in claim 15 wherein the refractive index of the uppercladding layer is between 1.4550 and 1.4600.

27. The method recited in claim 15 wherein the refractive index of the undercladding layer varies by less than 2% of 1.4575.

* * * * *